US007667633B2

(12) United States Patent
Choi et al.

(10) Patent No.: US 7,667,633 B2
(45) Date of Patent: Feb. 23, 2010

(54) TIME-TO-DIGITAL CONVERTER WITH HIGH RESOLUTION AND WIDE MEASUREMENT RANGE

(75) Inventors: Hyoung-Chul Choi, Suwon-si (KR); Seong-Hwan Cho, Daejeon (KR); So-Myung Ha, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/986,592

(22) Filed: Nov. 23, 2007

(65) Prior Publication Data

US 2008/0129574 A1 Jun. 5, 2008

(30) Foreign Application Priority Data

Nov. 24, 2006 (KR) ...................... 10-2006-0116644

(51) Int. Cl.
*H03M 1/50* (2006.01)

(52) U.S. Cl. ....................... 341/166; 341/118; 341/120; 341/156; 341/157; 327/156; 327/158; 327/160; 327/291; 327/293

(58) Field of Classification Search ................. 341/118, 341/120, 155, 156, 157, 159; 327/156, 158, 327/160, 291, 293
See application file for complete search history.

(56) References Cited

U.S. PATENT DOCUMENTS 4,090,191 A * 5/1978 Kinbara ...................... 341/118
4,308,524 A * 12/1981 Harrison et al. ............. 341/122
5,836,004 A * 11/1998 Jiang et al. .................. 341/166
6,097,674 A * 8/2000 Swapp ......................... 368/113
6,750,692 B2 * 6/2004 Jang ........................... 327/291
6,754,613 B2 * 6/2004 Tabatabaei et al. .......... 702/189
6,993,109 B2 * 1/2006 Lee et al. .................... 375/376
7,205,924 B2 * 4/2007 Vemulapalli et al. ........ 341/166
7,330,144 B2 * 2/2008 Terazawa et al. ............ 341/157
2005/0088331 A1 4/2005 Krymski
2006/0132340 A1 6/2006 Lin
2007/0096836 A1 * 5/2007 Lee et al. ....................... 331/57
2007/0098731 A1 * 5/2007 Burnie et al. ............ 424/167.1
2007/0273569 A1 * 11/2007 Lin ............................ 341/155
2008/0111720 A1 * 5/2008 Huang et al. .................. 341/53
2008/0238652 A1 * 10/2008 Henzler et al. .............. 340/527
2008/0267280 A1 * 10/2008 Yousif et al. ................ 375/239
2008/0309542 A1 * 12/2008 Tanizawa .................... 341/163

OTHER PUBLICATIONS

Korean Patent Application No. 1999-44298 to Lee et al., having Publication date of Dec. 15, 2000 (w/ English Abstract page).
Korean Patent Application No. 10-2001-0033521 to Kim, having Publication date of Dec. 27, 2002 (w/ English Abstract page).

* cited by examiner

*Primary Examiner*—Linh V Nguyen
(74) *Attorney, Agent, or Firm*—Monica H. Choi

(57) ABSTRACT

A time-to-digital converter includes low and high resolution time-to-digital converters for providing both high resolution and wide measurement range. The low resolution time-to-digital converter measures a time difference between first and second signals with a first quantization step. The high resolution time-to-digital converter measures the time difference between the first and second signals with a second quantization step that is smaller than the first quantization step. The low resolution time-to-digital converter has a wider measurement range than the high resolution time-to-digital converter.

19 Claims, 14 Drawing Sheets

TIME-TO-DIGITAL CONVERTER WITH HIGH RESOLUTION AND WIDE MEASUREMENT RANGE

BACKGROUND OF THE INVENTION

This application claims priority under 35 USC § 119 to Korean Patent Application No. 2006-116644 filed on Nov. 24, 2006 in the Korean Intellectual Property Office, the disclosure of which is incorporated herein in its entirety by reference.

1. Field of the Invention

The present invention relates generally to time-to-digital converters, and more particularly, to a time-to-digital converter with low and high resolution converters for high resolution and wide measurement range.

2. Background of the Invention

A time-to-digital converter (TDC) measures a time difference between signals. Traditionally, the time-to-digital converter has been used in a laser range finder. Recently, the time-to-digital converter is used in a digital phased locked loop.

FIG. 1 is a timing diagram illustrating fundamental operations of a time-to-digital converter. The time-to-digital converter compares two signals for generating a digital code corresponding to a time difference between the two signals. The time-to-digital converter measures the time difference between a first signal and a second signal in units of a quantization step tq. The measured time difference tm may be different from an actual time difference ta.

The difference between the measured value tm and the actual value ta corresponds to a quantization error. The quantization error may be as large as the quantization step tq. A high resolution time-to-digital converter has a relatively small quantization step tq, and a low resolution time-to-digital converter has a relatively large quantization step tq.

FIG. 2A shows a circuit diagram of a conventional time-to-digital converter 200 with a single delay line. The time-to-digital converter 200 includes a delay line 210 for transmitting a first signal, a reference line 220 for transmitting a second signal, and a comparator 230 that compares voltages at nodes of the delay line 210 with the voltage of the reference line 220. The comparator 230 includes flip-flops 231, 232, 233 and 234, each having a respective input coupled to a respective node of the delay line 210 and a respective clock terminal coupled to the reference line 220.

The time difference between the first signal and the second signal is determined according to outputs Q1, Q2, Q(n−1), and Qn of the flip-flops 231, 232, 233 and 234. Each of the delay units 211, 212 and 213 in the delay line 210 may be an inverter having a delay time of 50 ps such that a resolution of the time-to-digital converter in FIG. 2B is about 50 ps.

FIG. 2B is a plot of a time difference versus the output of the time-to-digital converter 200 of FIG. 2A. Referring to FIG. 2B, the time difference between the first and second signals is measured by units of a quantization step. When an error between the measured time difference and the actual time difference is smaller than the quantization step within a dead-zone, the time-to-digital converter 200 may determine that a phase of the first signal is same as a phase of the second signal.

Such a dead zone in FIG. 2B may cause jitter in an all-digital phase-locked loop (ADPLL) operating at a high frequency with the time-to-digital converter 200. The resolution of the time-to-digital converter should be increased to reduce the dead zone.

FIG. 3A is a circuit diagram of a conventional time-to-digital converter 300 including a vernier delay line. The time-to-digital converter 300 has two delay lines including a first delay line 310 and a second delay line 320 in contrast to the time-to-digital converter 200 of FIG. 2A. Each of a plurality of delay units 311, 312 and 313 of the first delay line 310 has a first delay time that is different from a second delay time of each of a plurality of delay units 321, 322 and 323 of the second delay line 320. For example, the first delay time for each of the delay units 311, 312 and 313 of the first delay line 310 is 50 ps, and the second delay time for each of the delay units 321, 322 and 323 of the second delay line 320 is 55 ps.

The time-to-digital converter 300 also includes a comparator 330 with a plurality of flip-flops 331, 332, 333 and 334. Each of the flip-flops 331, 332, 333 and 334 has a respective input coupled to a corresponding node between the delay units of the first delay line 310, and has a respective clock terminal coupled to a corresponding node between the delay units of the second delay line 320. The quantization step (i.e., resolution) of the time-to-digital converter 300 including the vernier delay line is 5 ps.

FIG. 3B is a plot of a time difference versus the output of the time-to-digital converter 300 of FIG. 3A. Referring to FIG. 3B, the time difference between the first and second signals is measured by units of the quantization step. The quantization step of the time-to-digital converter 300 of FIG. 3A is smaller than the quantization step of the time-to-digital converter 200 of FIG. 2A.

Thus, the time-to-digital converter 300 has a reduced dead zone. However, because of the smaller quantization step of the time-to-digital converter 300, a measurement range of the time difference of the first and second signals is reduced. Thus, the time-to-digital converter 300 may not measure a time difference larger than a measurement range.

In addition, an increase in the number of delay units and flip-flops for expanding the measurement range disadvantageously increases chip size. Furthermore, a time-to-digital converter including a vernier delay line occupies larger chip size than a time-to-digital converter including a single delay line, if both of the time-to-digital converters include the same number of flip-flops.

SUMMARY OF THE INVENTION

A time-to-digital converter according to an aspect of the present invention includes a low resolution time-to-digital converter and a high resolution time-to-digital converter for providing both high resolution and wide measurement range. The low resolution time-to-digital converter measures a time difference between first and second signals with a first quantization step. The high resolution time-to-digital converter measures the time difference between the first and second signals with a second quantization step that is smaller than the first quantization step. The low resolution time-to-digital converter has a wider measurement range than the high resolution time-to-digital converter In an embodiment of the present invention, the low and high resolution time-to-digital converters are fabricated on a same integrated circuit die.

In another embodiment of the present invention, the time-to-digital converter includes at least one encoder for generating a digital code corresponding to the time difference between the first and second signals from a respective code received from each of the low and high resolution time-to-digital converters.

In a further embodiment of the present invention, the first signal is applied to the low resolution time-to-digital converter after a delay through the high resolution time-to-digital converter, and the second signal is applied simultaneously to the low and high resolution time-to-digital converters. Alternatively, the first and second signals are applied simultaneously to the low and high resolution time-to-digital converters. In another embodiment of the present invention, the first and second signals are applied to the low resolution time-to-digital converter after respective delays through the high resolution time-to-digital converter.

In a further embodiment of the present invention, the low resolution time-to-digital converter includes first and second transmission lines, a plurality of flip-flops, and an encoder. The first transmission line is comprised of a plurality of active delay units that are series connected for transmitting the first signal. The second transmission line is for transmitting the second signal. Each of the plurality of flip-flops has a respective input terminal connected to a respective node between the active delay units, and each has a respective clock terminal connected to the second transmission line. The encoder generates a low resolution digital code from outputs of the flip-flops.

In an example embodiment of the present invention, the plurality of active delay units is a plurality of inverters each providing a predetermined same delay.

In a further embodiment of the present invention, the high resolution time-to-digital converter includes first and second high resolution transmission lines, a plurality of comparators, and an encoder. The first high resolution transmission line is comprised of first resistors that are serially connected for transmitting the first signal. The second high resolution transmission line is comprised of second resistors that are serially connected for transmitting the second signal. Each of the plurality of comparators compares a respective first voltage of a respective first node of the first high resolution transmission line and a respective second voltage of a respective second node of the second high resolution transmission line. The encoder generates a high resolution digital code from outputs of the comparators.

In an example embodiment of the present invention, the encoder for generating the high resolution digital code is a same one encoder for generating a low resolution digital code for the low resolution time-to-digital converter. Alternatively, the encoder for generating the high resolution digital code is separate from another encoder for generating a low resolution digital code for the low resolution time-to-digital converter.

In a further embodiment of the present invention, a first direction of transmission of the first signal through the first high resolution transmission line is same as a second direction of transmission of the second signal through the second high resolution transmission line. In that case, a first resistance of each of the first resistors is same as a second resistance of each of the second resistors.

In another embodiment of the present invention, a first direction of transmission of the first signal through the first high resolution transmission line is opposite from a second direction of transmission of the second signal through the second high resolution transmission line. In that case, a first resistance of each of the first resistors is different from a second resistance of each of the second resistors. In a further embodiment of the present invention, the first and second resistors are fabricated with metal lines and via plugs. In another embodiment of the present invention, each of the comparators is laid out symmetrically between the first and second high resolution transmission lines.

In a further embodiment of the present invention, the time-to-digital converter is connected within a digital phase-locked loop. The digital phase-locked loop includes a digital filter, a digital controlled oscillator, and a frequency divider. The digital filter generates a digital control code from a low resolution code received from the low resolution time-to-digital converter and from a high resolution code received from the high resolution time-to-digital converter. The digital controlled oscillator generates an output clock signal with a frequency dependent on the digital control code. The frequency divider generates a divided clock signal having a lower frequency than the output clock signal. The divided clock signal is the first signal, and the second signal is a reference clock signal.

In this manner, the time-to-digital converter has a reduced dead zone from the smaller quantization step of the high resolution time-to-digital converter. In addition, the time-to-digital converter has a wide measurement range from the larger quantization step of the low resolution time-to-digital converter.

BRIEF DESCRIPTION OF THE DRAWINGS

The above and other features and advantages of the present invention will become more apparent when described in detailed exemplary embodiments thereof with reference to the attached drawings in which.

Figure 1:
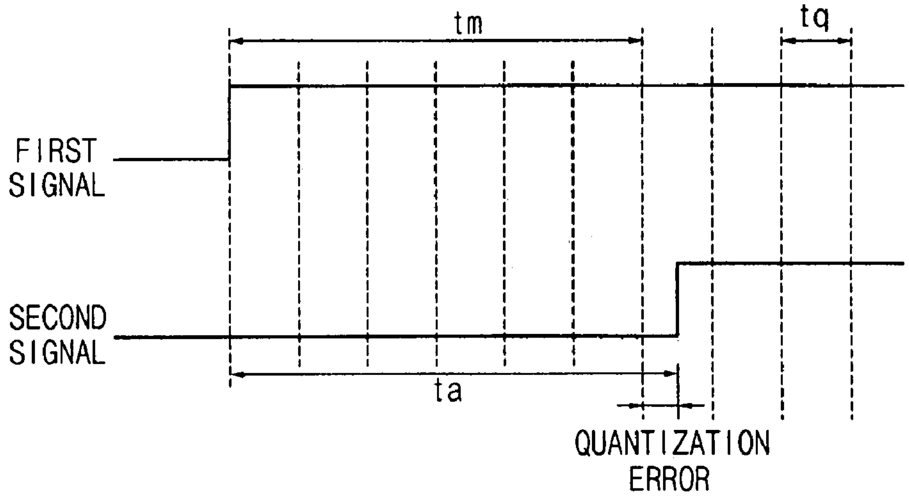
FIG.1 (CONVENTIONAL ART)
FIG. 1 is a timing diagram illustrating fundamental operations of a time-to-digital converter as known in the prior art.
Figure 2A:
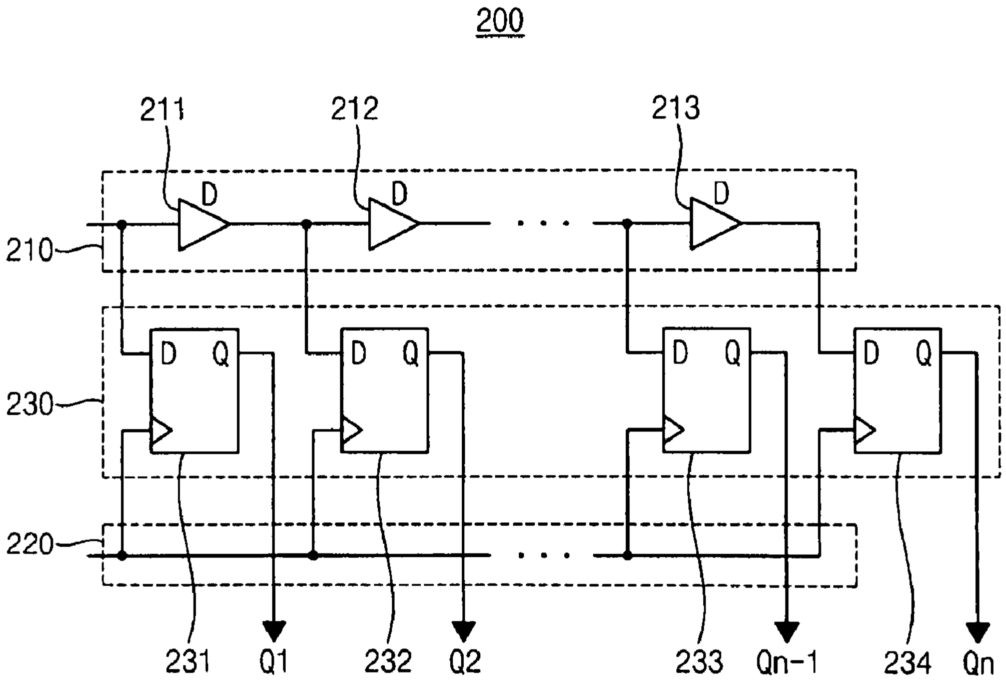
FIG.2A (CONVENTIONAL ART)
FIG. 2A is a circuit diagram of a conventional time-to-digital converter with a single delay line and high quantization step, as known in the prior art.
Figure 2B:
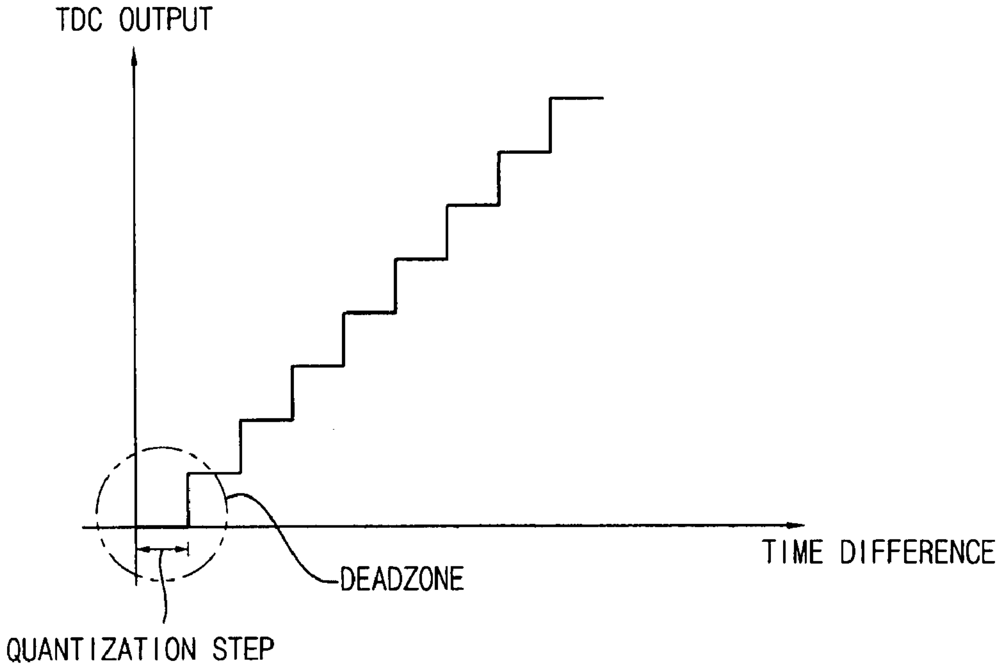
FIG.2B (CONVENTIONAL ART)
FIG. 2B is a plot illustrating an output of the time-to-digital converter of FIG. 2A, as known in the prior art.
Figure 3A:
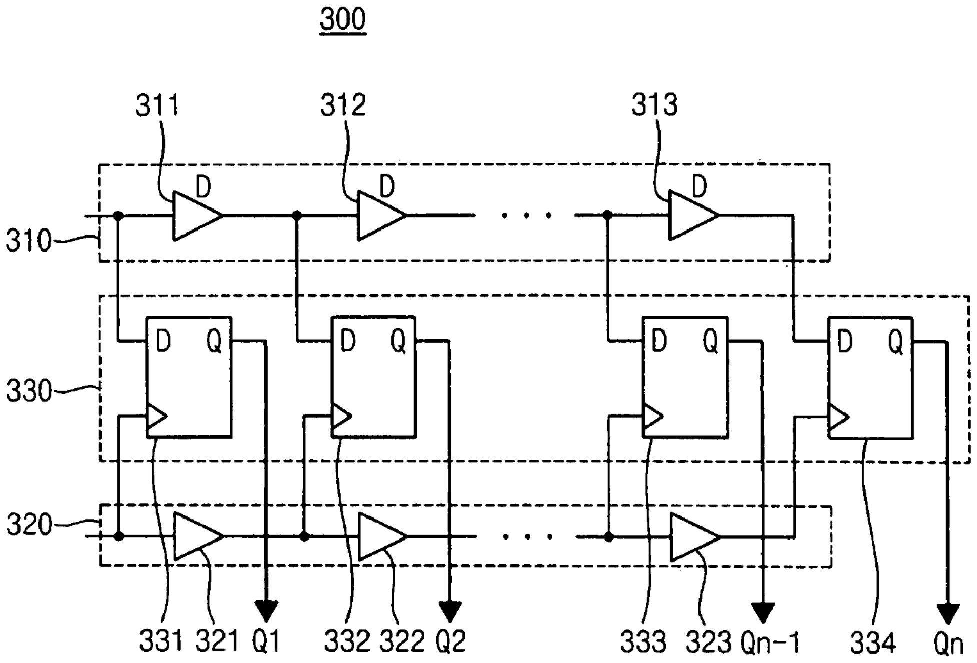
FIG.3A (CONVENTIONAL ART)
FIG. 3A is a circuit diagram of a conventional time-to-digital converter including a vernier delay line, as known in the prior art.
Figure 3B:
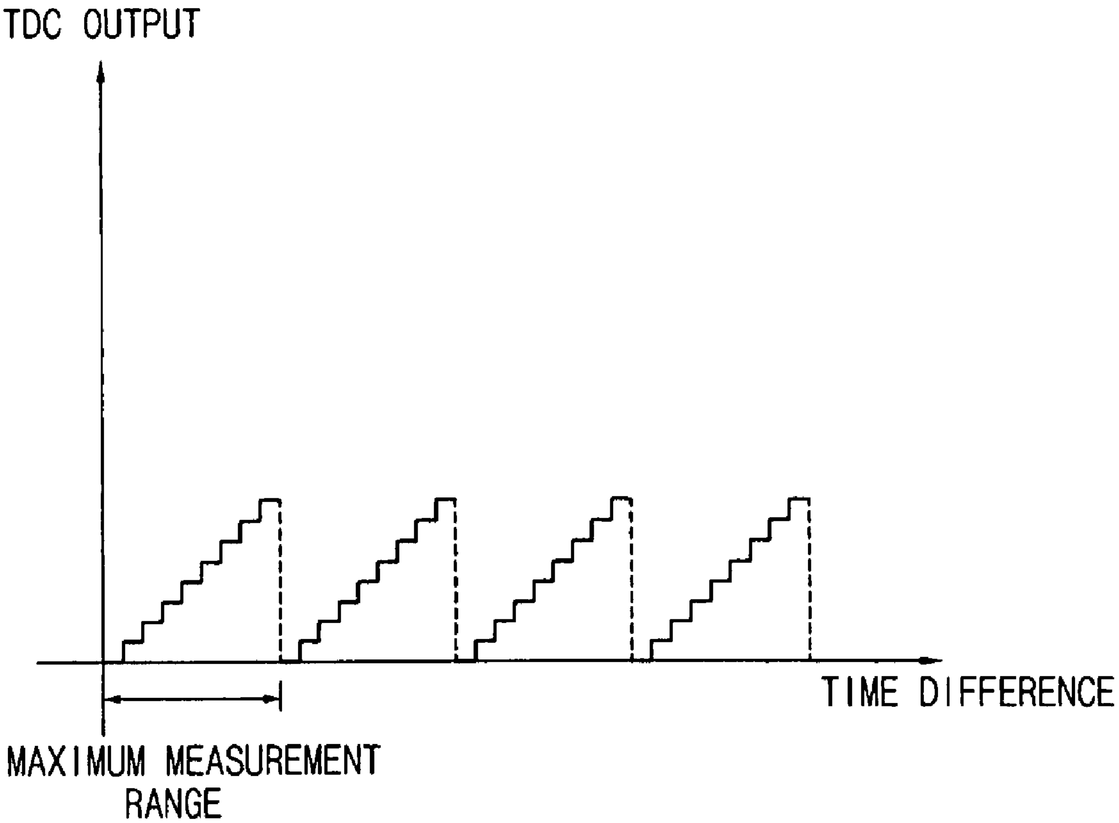
FIG.3B (CONVENTIONAL ART)
FIG. 3B is a plot illustrating an output of the time-to-digital converter of FIG. 3A, as known in the prior art.

The figures referred to herein are drawn for clarity of illustration and are not necessarily drawn to scale. Elements having the same reference number in FIGS. 1, 2A, 2B, 3A, 3B, 4A, 4B, 5, 6, 7, 8, 9, 10, 11, 12, 13A, 13B, 13C, 14, 15, and 16 refer to elements having similar structure and/or function.

DETAILED DESCRIPTION OF THE INVENTION

Embodiments of the present invention are now described more fully with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
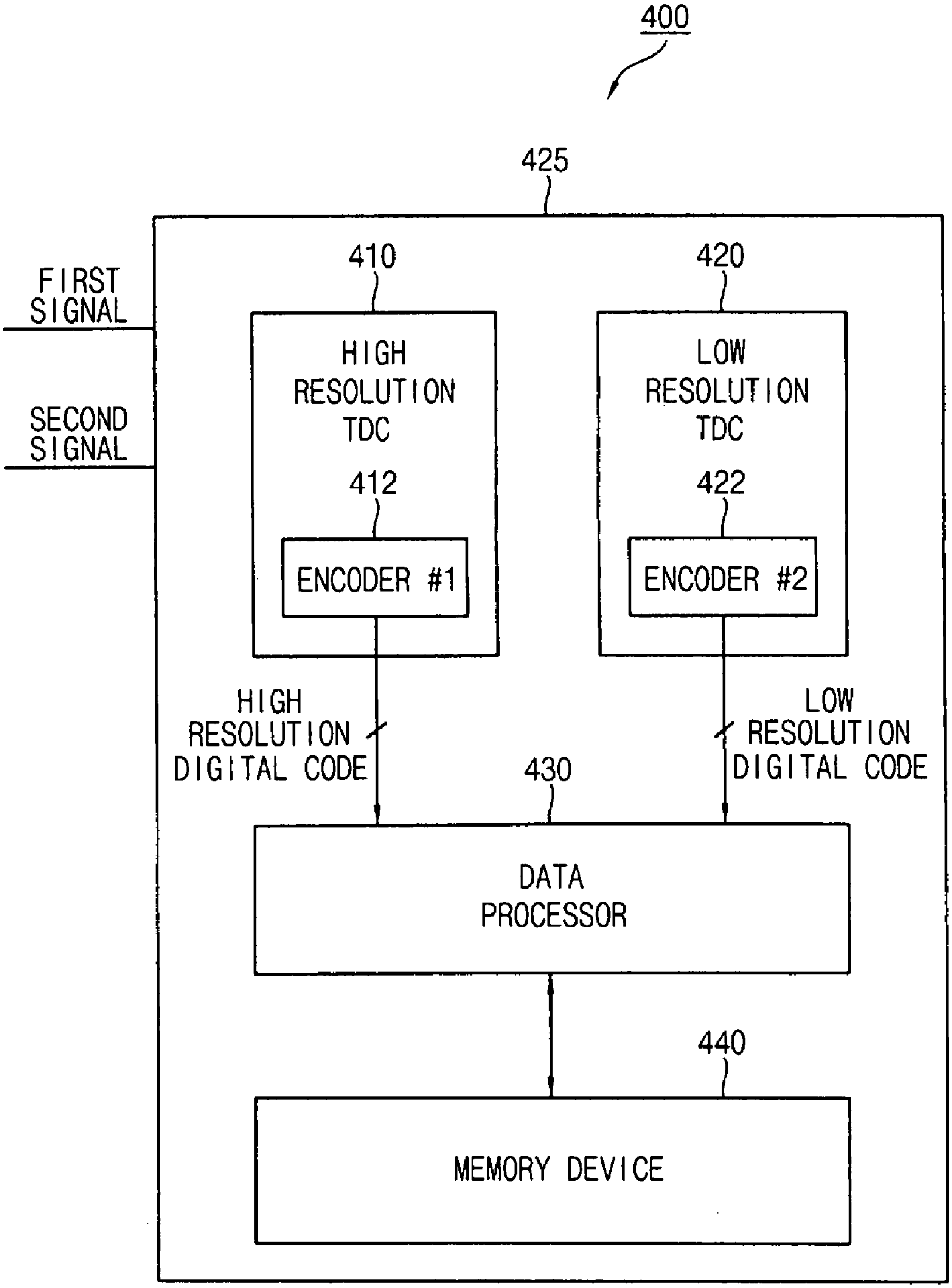
FIG. 4A is a block diagram of a time-to-digital converter having low and high resolution time-to-digital converters, according to an embodiment of the present invention.

FIG. 4A is a block diagram of a time-to-digital converter 400 according to an example embodiment of the present invention. A time-to-digital converter 400 generates a time difference code that indicates a measure of a time difference between a first signal and a second signal. The time-to-digital converter 400 includes a high resolution time-to-digital converter (TDC) 410 having a first encoder 412 and a low resolution time-to-digital converter (TDC) 420 having a second encoder 422.

The time-to-digital converter 400 also includes a data processor 430 coupled to the first encoder 412 and the second encoder 422. The time-to-digital converter 400 further includes a memory device 440 coupled to the data processor 430. The memory device 440 has sequences of instructions (i.e., software) stored thereon and execution of such sequences of instructions by the data processor 430 causes the data processor 430 to perform the steps of the flow-chart of FIG. 16.

The components 410, 412, 420, 422, 430, and 440 are fabricated within a single integrated circuit die 425 of the time-to-digital converter 400 according to an embodiment of the present invention.

The high resolution TDC 410 measures the time difference between the first signal and the second signal with a first quantization at a high resolution. The low resolution time-to-digital converting circuit 420 measures the time difference between the first signal and the second signal at a low resolution.

The low resolution TDC 420 measures the time difference between the first and second signals with a first quantization step. The high resolution TDC 410 measures the time difference between the first and second signals with a second quantization step that is smaller than the first quantization step of the low resolution TDC 420. Thus, the low resolution TDC 420 has a larger measurement range with higher quantization step than the high resolution TDC 410.

The first encoder 412 of the high resolution TDC 410 generates a high resolution digital code representing the measurement of the time difference between the first and second signals with the smaller quantization step. The second encoder 422 of the low resolution TDC 420 generates a low resolution digital code representing the measurement of the time difference between the first and second signals with the larger quantization step.

Figure 4B:
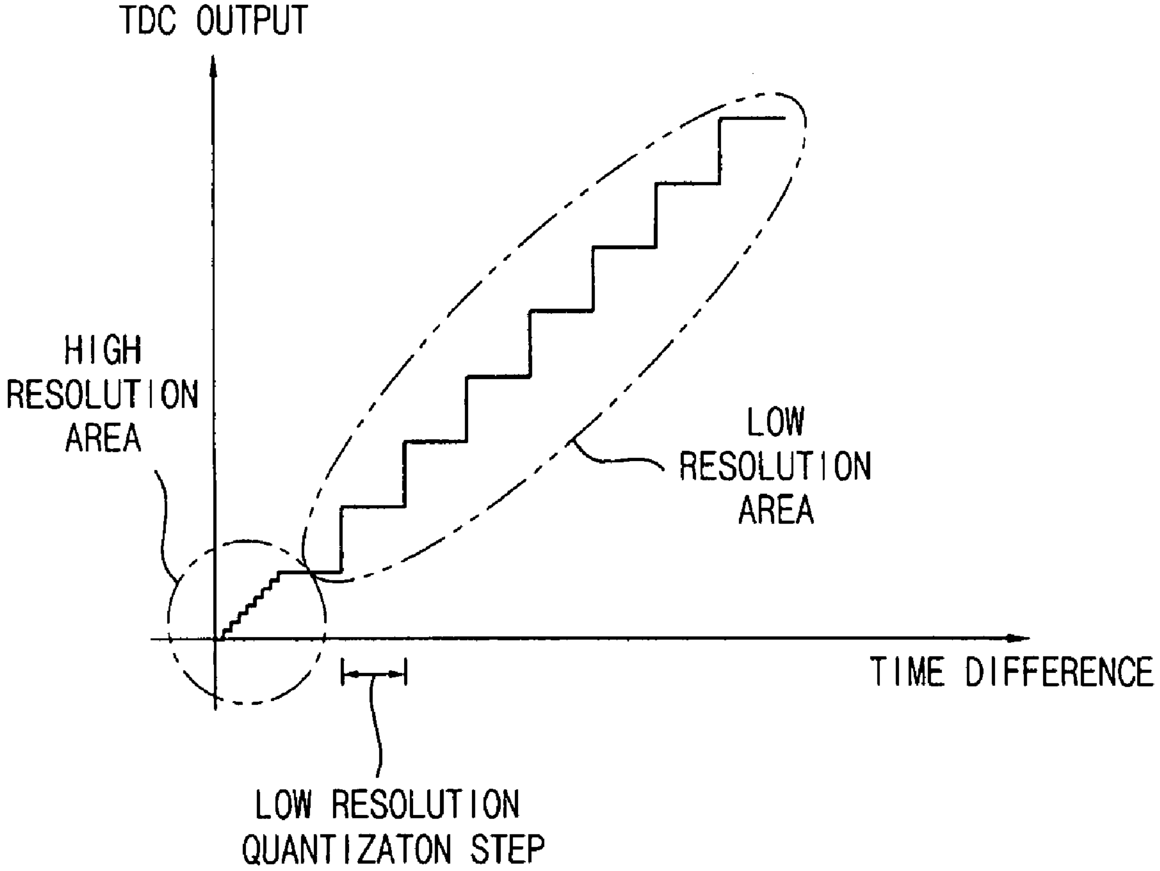
FIG. 4B is a plot illustrating an output of the time-to-digital converter of FIG. 4A, according to an embodiment of the present invention.

FIG. 4B is a plot of the time difference between the first and second signals versus an output of the time-to-digital converter 400 of FIG. 4A. Note that at the lower time difference between the first and second signals which may be a dead zone of the low resolution TDC 420, the output of the high resolution TDC 410 is used such that the dead zone of the time-to-digital converter 400 is significantly reduced.

Furthermore, the higher quantization step of the low resolution TDC 420 allows for a wide measurement range of the time difference between the first and second signals. Also by having the two low and high resolution TDCs 410 and 420 with different quantization steps, the size of the integrated circuit 425 may be minimized than if one TDC with one quantization step were used as in the prior art.

Figure 16:
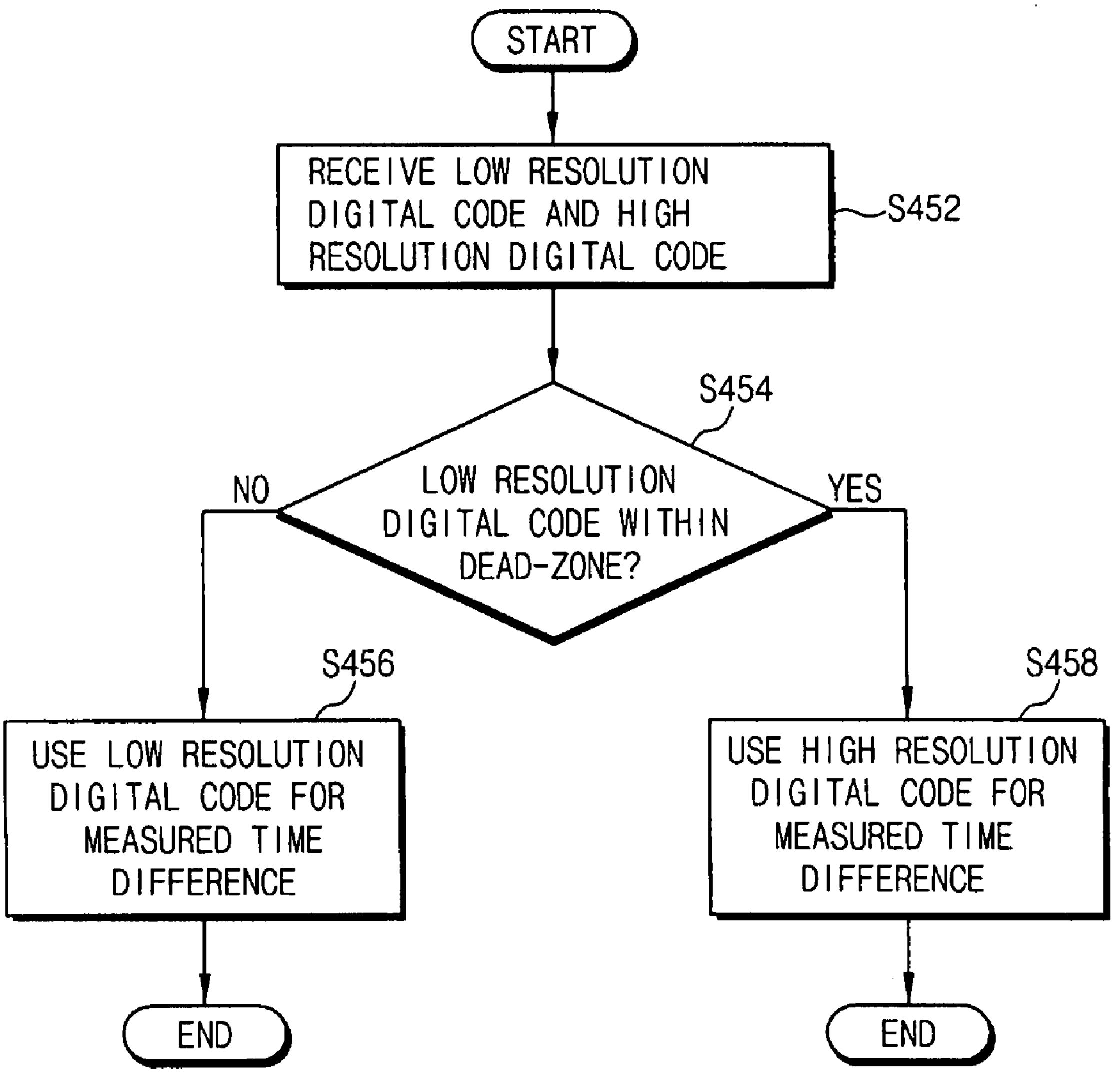
FIG. 16 is as flow-chart of steps executed by a data processor in the time-to-digital converter of FIG. 4A, according to an example embodiment of the present invention.

Referring to FIGS. 4A, 4B, and 16, during operation of the time-to-digital converter 400, the high resolution TDC 410 and the low resolution TDC 420 generate the high resolution digital code and the low resolution digital code, respectively, from the first and second signals. The data processor 430 receives such high and low resolution digital codes from the first and second encoders 412 and 422, respectively, of the high and low resolution TDCs 410 and 420, respectively (step S452 of FIG. 16).

The data processor 420 determines whether the low resolution digital code is within a dead-zone of the low resolution TDC 420 (step S454 of FIG. 16). If the low resolution digital code is not within the dead-zone of the low resolution TDC 420, the data processor 420 uses the low resolution digital code from the second encoder 422 for determining the measured time difference between the first and second signals (step S456 of FIG. 16). On the other hand, if the low resolution digital code is within the dead-zone of the low resolution TDC 420, the data processor 420 uses the high resolution digital code from the first encoder 412 for determining the measured time difference between the first and second signals (step S458 of FIG. 16).

Figure 5:
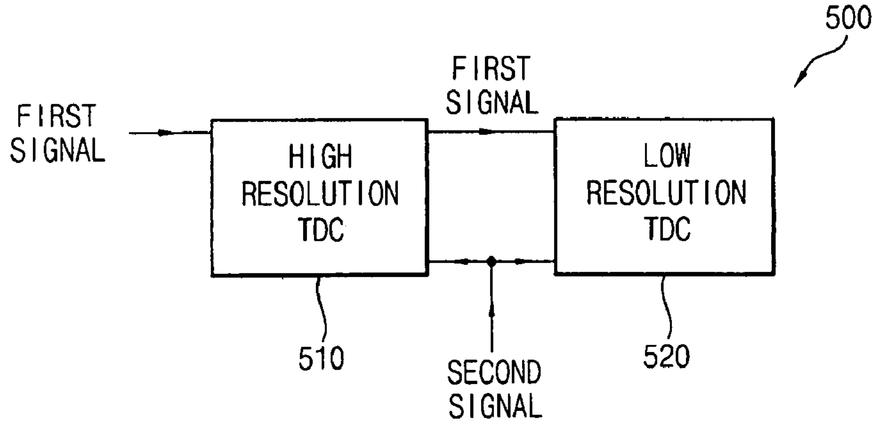
FIG. 5 is a block diagram of the time-to-digital converter of FIG. 4A with a first signal applied differently and a second signal applied similarly to the low and high resolution time-to-digital converters, according to an embodiment of the present invention.

FIG. 5 is a block diagram illustrating application of the first and second signals to high and low resolution TDCs 510 and 520, respectively, within a time-to-digital converter 500, according to one embodiment of the present invention. Such high and low resolution TDCs 510 and 520 may be the high and low resolution TDCs 410 and 420 of FIG. 4A for example.

Referring to FIG. 5, the second signal is simultaneously provided to the high and low resolution TDCs 510 and 520. In contrast, the first signal is provided to the high resolution TDC 510 initially, and then the first signal delayed through the high resolution TDC 510 is provided to the low resolution TDC 520. In that case, the data processor 430 determines the measured time difference with information regarding such delay through the high resolution TDC 510.

Figure 6:
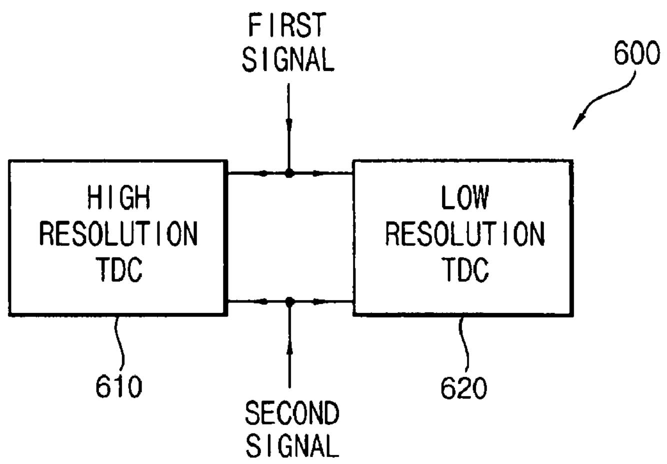
FIG. 6 is a block diagram of the time-to-digital converter of FIG. 4A with the first and second signals applied similarly to the low and high resolution time-to-digital converters, according to an embodiment of the present invention.

FIG. 6 is a block diagram illustrating application of the first and second signals to high and low resolution TDCs 610 and 620, respectively, within a time-to-digital converter 600, according to another embodiment of the present invention. Such high and low resolution TDCs 610 and 620 may be the high and low resolution TDCs 410 and 420 of FIG. 4A for example. Referring to FIG. 6, the first and second signals are each simultaneously provided to the low and high resolution TDCs 610 and 620.

Figure 7:
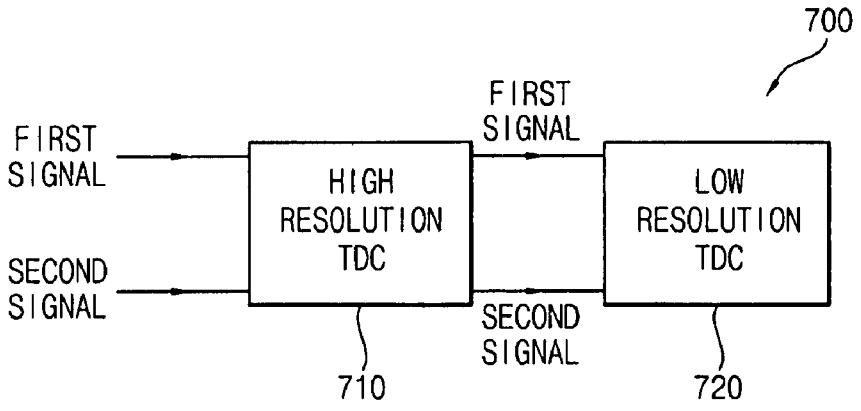
FIG. 7 is a block diagram of the time-to-digital converter of FIG. 4A with the first and second signals applied differently to the low and high resolution time-to-digital converters, according to an embodiment of the present invention.

FIG. 7 is a block diagram illustrating application of the first and second signals to high and low resolution TDCs 710 and 720, respectively, within a time-to-digital converter 700, according to another embodiment of the present invention. Such high and low resolution TDCs 710 and 720 may be the high and low resolution TDCs 410 and 420 of FIG. 4A for example. Referring to FIG. 7, each of the first and second signals is provided to the high resolution TDC 710 first. Then, both of the first and second signals that are delayed through the high resolution TDC 710 are provided to the low resolution TDC 720.

Figure 8:
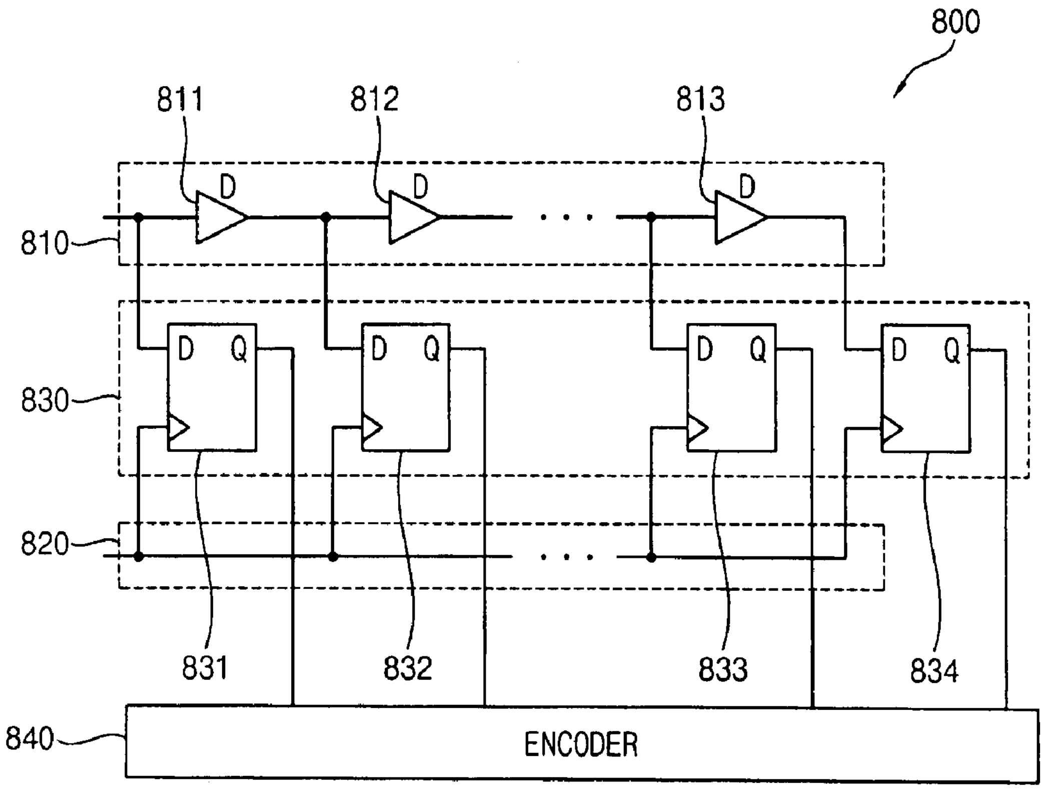
FIG. 8 is a block diagram of the low resolution time-to-digital converter in FIG. 4A, according to an embodiment of the present invention.

The low resolution TDC 410 of FIG. 4A is implemented with a single delay line in one embodiment of the present invention as illustrated in FIG. 8. FIG. 8 is a circuit diagram of a low resolution time-to-digital converter (TDC) 800 which may be the low resolution TDC 420 of FIG. 4A according to an embodiment of the present invention.

Referring to FIG. 8, the low resolution TDC 800 includes a first low resolution transmission line 810 for transmitting the first signal and a second low resolution transmission line 820 for transmitting the second signal. The low resolution TDC 800 also includes a comparator 830 for comparing voltages at nodes of the first low resolution transmission line 810 with voltages at nodes of the second low resolution transmission line 820. In addition, an encoder 840 (i.e., 422 in FIG. 4A) receives outputs from the comparator 830 to generate a low resolution digital code.

The first low resolution transmission line 810 includes delay units 811, 812 and 813 that may be active delay units such as inverters for example. In an example embodiment of the present invention, a respective delay time of each of the delay units 811, 812 and 813 is same such as tens of picoseconds for example. In the example of FIG. 8, the first low resolution transmission line 810 is a delay line, whereas the second low resolution transmission line 820 is a typical signal line without significant delay.

The comparator 830 includes a plurality of flip-flops 831, 832, 833 and 834. Each of the flip-flops 831, 832, 833 and 834 has a respective input terminal coupled to a respective node of the first low resolution transmission line 810. In addition, each of the flip-flops 831, 832, 833 and 834 has a respective clock terminal coupled to the second low resolution transmission line 820.

When the delay units 811, 812 and 813 are inverters, the odd-number positioned flip-flops may be clocked with a rising edge of the second signal, and the even-number positioned flip-flops may be clocked with a falling edge of the second signal. The encoder 840 generates the low resolution digital code indicating the time difference between the first and second signals from the outputs of the flip-flops 831, 832, 833 and 834. For example, the flip-flops 831, 832, 833 and 834 generate a thermometer code that the encoder 840 converts to a binary code as the low resolution digital code.

Figure 9:
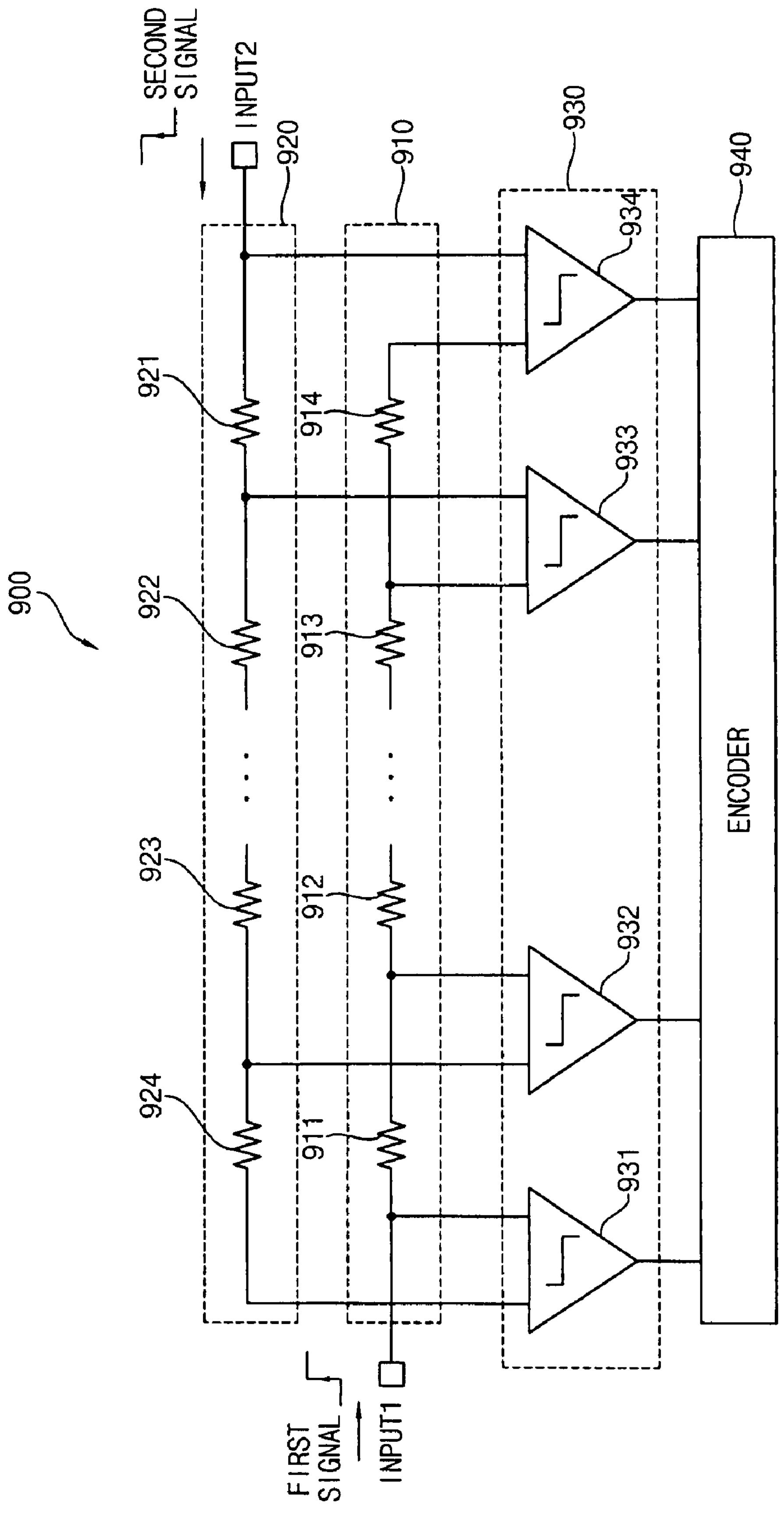
FIG. 9 is a block diagram of the high resolution time-to-digital converter in FIG. 4A, according to an embodiment of the present invention.

FIG. 9 is a circuit diagram of a high resolution time-to-digital converter (TDC) 900 which may be the high resolution TDC 410 of FIG. 4A according to an embodiment of the present invention. The high resolution TDC 900 includes a first high resolution transmission line 910 and a second high resolution transmission line 920, each including series-connected resistors. The high resolution TDC 900 also includes a comparator unit 930 and an encoder 940 (i.e., 412 in FIG. 4A).

The first signal is applied at a first node of the first high resolution transmission line 910 such that the first signal is transmitted to a last node of the first high resolution transmission line 910 through a plurality of series-connected resistors 911, 912, 913 and 914. The second signal is provided to a first node of the second high resolution transmission line 920 such that the second signal is transmitted to a last node of the second high resolution transmission line 920 through a plurality of series-connected resistors 921, 922, 923 and 924.

Thus, both of the high resolution transmission lines 910 and 920 are delay lines. In an example embodiment of the present invention, each of the resistors 911, 912, 913, 914, 921, 922, 923 and 924 of the first and second high resolution transmission lines 910 and 920 has a substantially same respective resistance.

The first node of the first high resolution transmission line 910 corresponds to the last node of the second high resolution transmission line 920 with such nodes being coupled to inputs of a same comparator 931. Similarly, the last node of the first high resolution transmission line 910 corresponds to the first node of the second high resolution transmission line 920 with such nodes being coupled to input of a same comparator 934.

In this manner, in the example of FIG. 9, the first signal is transmitted through the first high resolution transmission line 910 in opposite direction from the second signal being transmitted through the second high resolution transmission line 920 for reducing unbalance of delay times through such delay lines 910 and 920. For example, the delay time for the first signal to pass through the resistor 911 may be larger than the delay time to pass through the resistor 912. Likewise, the delay time for the first signal to pass through the resistor 912 may be larger than the delay time to pass through the resistor 913. Also, the delay time for the first signal to pass through the resistor 913 may be larger than the delay time to pass through the resistor 914.

On the other hand, the delay time for the second signal to pass through the resistor 921 may be larger than the delay time to pass through the resistor 922. Likewise, the delay time for the second signal to pass through the resistor 922 may be larger than the delay time to pass through the resistor 923. Similarly, the delay time for the second signal to pass through the resistor 923 may be larger than the delay time to pass through the resistor 924. Such unbalance of delay times may be reduced when the first and second signals are transmitted through the first and second high resolution transmission lines 910 and 920 in opposite directions.

The comparator unit 930 includes a plurality of comparators 931, 932, 933, and 934. The comparator 931 compares a voltage at the first node of the first high resolution transmission line 910 with a voltage at the last node of the second high resolution transmission line 920. The comparator 932 compares a voltage at a node between the resistors 911 and 912 of the first high resolution transmission line 910 with a voltage at a node between the resistors 924 and 923 of the second high resolution transmission line 920.

The comparator 933 compares a voltage at a node between the resistors 913 and 914 of the first high resolution transmission line 910 with a voltage at a node between the resistors 922 and 921 of the second high resolution transmission line 920. The comparator 934 compares a voltage at the last node of the first high resolution transmission line 910 with a voltage at the first node of the second high resolution transmission line 920.

The encoder 940 receives the outputs of the comparators 931, 932, 933, and 934 to generate a high resolution digital code indicating the time difference between the first and second signals. For example, the encoder 940 generates a binary code as such a high resolution digital code.

A respective resistance of any resistor in the transmission lines 910 and 920 is desired to be smaller than 10 ohms such that the high resolution TDC 900 has a quantization step that is less than 1 pico-second. Generally, resistors having resistance of hundreds of ohms may be parallel-connected to obtain a smaller resistance. However, such resistors would disadvantageously increase a size of the transmission lines 910 and 920.

Figure 10:
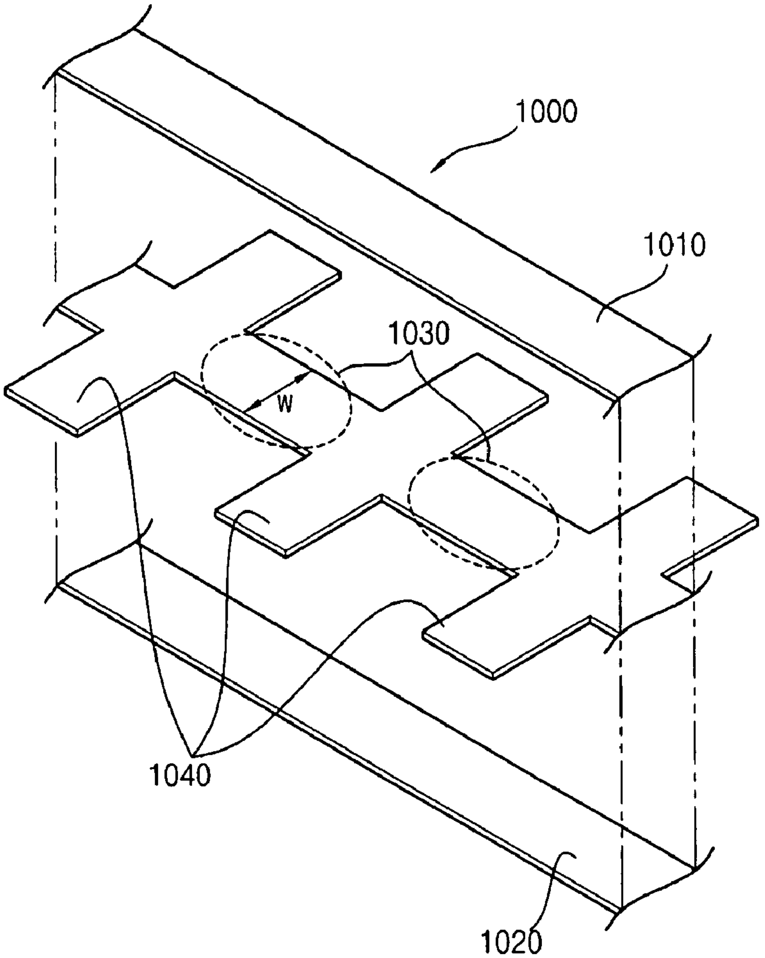
FIG. 10 shows a plan view of metal layers for forming a resistor in the high resolution time-to-digital converter of FIG. 9, according to an embodiment of the present invention.
Figure 11:
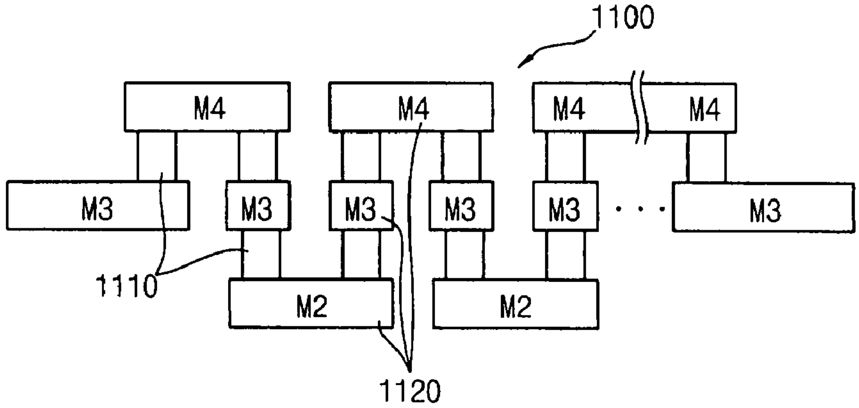
FIG. 11 shows an example cross-sectional view of metal lines and via plugs for forming a resistor in the high resolution time-to-digital converter of FIG. 9; according to an embodiment of the present invention.

FIGS. 10 and 11 are a plan view and a cross-sectional view of metal lines and via plugs for forming a resistor with low resistance such as less than ten ohms within the transmission line 910 or 920. Referring to FIG. 10, a signal line 1000 which may be one of the transmission lines 910 or 920 is implemented with three metal layers. A metal line of a middle metal layer includes resistors 1030 and nodes 1040 for being coupled to the comparators 931, 932, 933, and 934.

The resistance of each resistor 1030 is determined according to the width W of the metal line. The resistance of the resistor 1030 increases with reduced width W, and such resistance decreases with increased width W. The nodes 1040 may be coupled to the inputs of the comparators 931, 932, 933, and 934 through via plugs or contact plugs. Parallel connection of such via plugs or contact plugs may be used for generating a small resistance.

For example, FIG. 11 illustrates another example of a resistor 1100 using three metal layers 1120. M2 represents a metal layer right over a lower most metal layer, M3 represents a metal layer over the metal layer M2, and M4 represents a metal layer over the metal layer M3. Via plugs 1110 are formed between such metal layers M2, M3, and M4.

The via plugs 1110 contribute a substantial portion of a resistance of the resistor 1100. The resistance of each metal line 1120 is much smaller than a resistance of each via plug 1110. When a resistance of a via plug 1110 is about 1 ohm, a series connection of three such via plugs generates a resistance of about 3 ohms. The resistance of a via may be difficult to control precisely from variation of its location. Instead, a resistor of 3 ohms may be formed from parallel connections of seven resistors each having resistance of 21 ohms formed from serial connection of twenty one via plugs.

In addition, each of the transmission lines 910 and 920 may further include two additional metal lines. A first additional metal line of a metal layer right below the metal layer for M2 and a second additional metal line of a metal layer above the metal layer for M4 may be formed for preventing external noise from propagating to the transmission lines 910 and 920.

Figure 12:
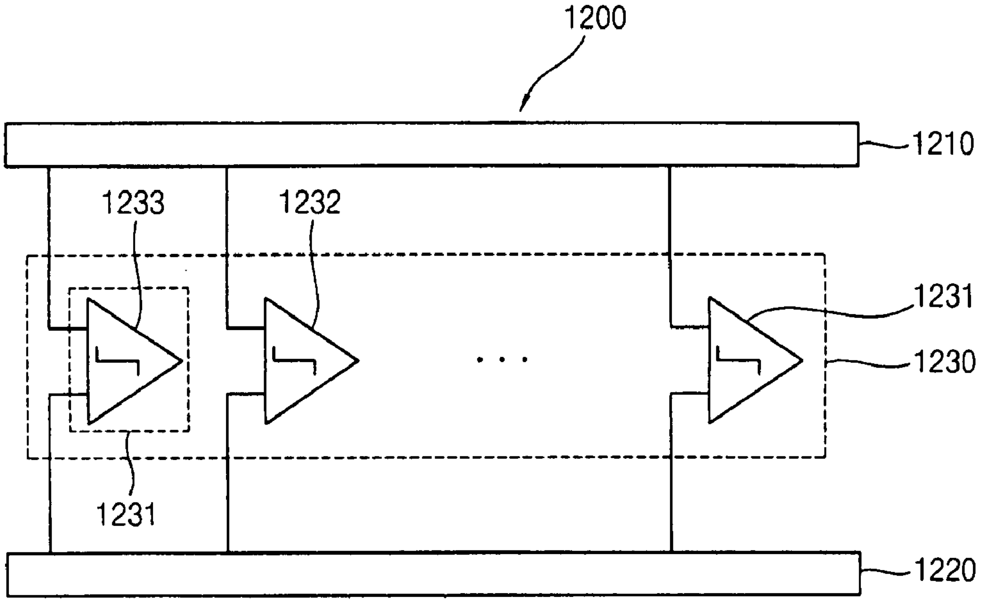
FIG. 12 illustrates a layout of the high resolution time-to-digital converter of FIG. 9, according to an embodiment of the present invention.

FIG. 12 illustrates a layout of a high resolution time-to-digital converter (TDC) 1200 which may be the high resolution TDC 900 of FIG. 9 according to an embodiment of the present invention. The high resolution TDC 1200 includes a first high resolution transmission line 1210 and a second high resolution transmission line 1220 disposed parallel with the first high resolution transmission line 1210. Such transmission lines 1210 and 1220 of FIG. 12 may be for the transmission lines 910 and 920, respectively, of FIG. 9. The high resolution TDC 1200 also includes a comparator unit 1230 with a plurality of comparators 1231, 1232, and 1233 disposed between the first and second high resolution transmission lines 1210 and 1220.

The first high resolution transmission line 1210 includes the serially-connected first resistors, and the second high resolution transmission line includes the serially-connected second resistors. The quantization step of the high resolution TDC 1200 is determined by the resistances of such first and second resistors. Such first and second resistors having small resistances may be implemented with the metal lines and/or the via plugs as described in reference to FIGS. 10 and 11

When the first signal is transmitted through the first high resolution transmission line 1210 with a same direction as the second signal being transmitted through the second high resolution transmission line 1220, each of the first resistors in the first high resolution transmission line 1210 has the same first resistance R1, and each of the second resistors in the second high resolution transmission line 1220 has the same second resistance R2 that is different from R1. Alternatively when the first signal is transmitted through the first high resolution transmission line 1210 with an opposite direction as the second signal being transmitted through the second high resolution transmission line 1220, each of the first resistors in the first high resolution transmission line 1210 and each of the second resistors in the second high resolution transmission line 1220 has a same resistance.

The comparators 1231, 1232, and 1233 compare first voltages at nodes of the first high resolution transmission line 1210 with second voltages at nodes of the second high resolution transmission line 1220. In an example embodiment of the present invention, each of the comparators 1231, 1232, and 1233 is laid out symmetrically between the transmission lines 1210 and 1220. Such layout of an example one of the comparators 1231, 1232, and 1233 is now described with reference to FIGS. 13A, 13B, and 13C.

Figure 13A:
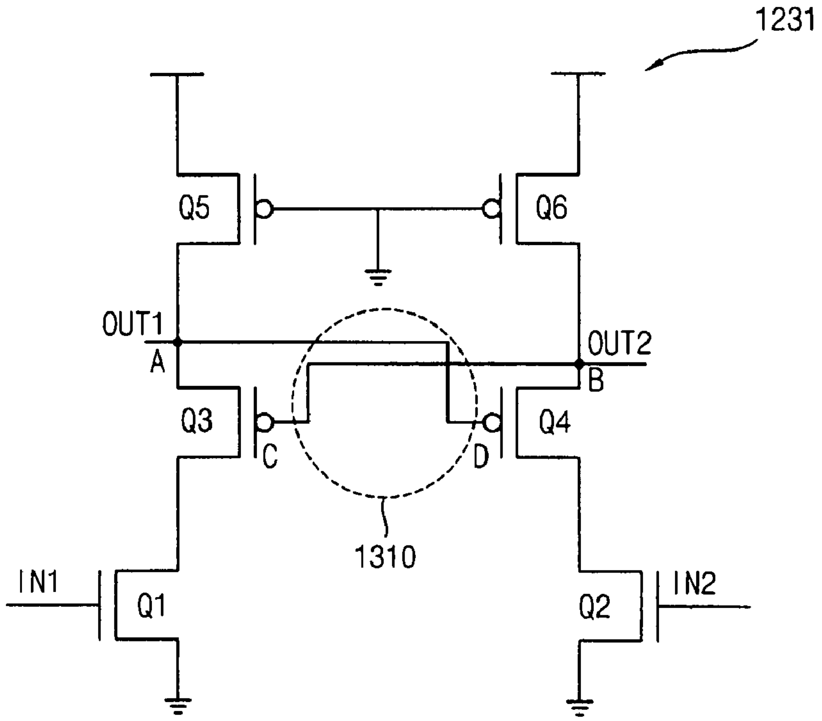
FIG. 13A is a circuit diagram of a comparator in the high resolution time-to-digital converter of FIG. 12, according to an embodiment of the present invention.

FIG. 13A is a circuit diagram of the example comparator 1231 of FIG. 12, according to an embodiment of the present invention. The other comparators 1232 and 1233 may also be implemented similarly as in FIG. 13A. A first NMOSFET (N-channel metal oxide semiconductor field effect transistor) Q1 has a gate connected to the first high resolution transmission line 1210, and a second NMSOFET Q2 has a gate connected to the second high resolution transmission line 1220. A voltage IN1 of the first high resolution transmission line 1210 is compared with a voltage IN2 of the second high resolution transmission line 1220.

Output terminals A and B of the comparator 1231 provide a result OUT1 and OUT2 of such a comparison of the two voltages IN1 and IN2. The comparator 1231 also includes PMOSFETs (P-channel metal oxide semiconductor field effect transistors) Q3, Q4, Q5, and Q6 configured as illustrated in FIG. 13A. The gate of the PMOSFET Q4 is connected to the output terminal A, and the gate of the PMOSFET Q3 is connected to the output terminal B, via a connection portion 1310. The comparator 1231 including the connection portion 1310 is laid out symmetrically for reducing an error in the time difference of the first and second signals as measured by the time-to-digital converter 1200.

Figure 13B:
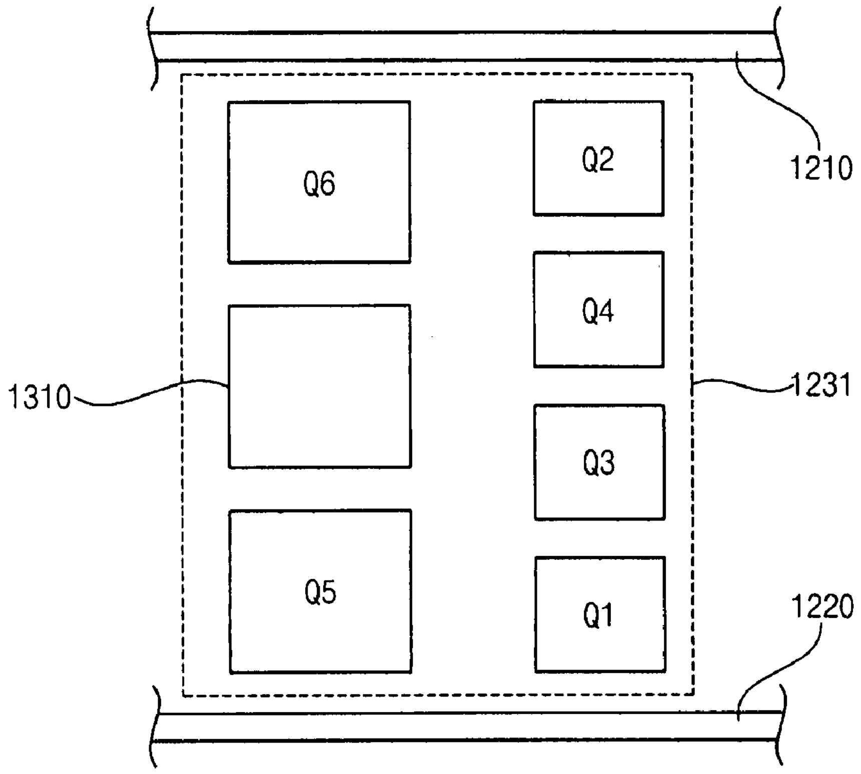
FIG. 13B illustrates a layout of transistors in the comparator of FIG. 13A, according to an embodiment of the present invention.

FIG. 13B illustrates a layout of the MOSFETs Q1, Q2, Q3, Q4, Q5 and Q6 of the comparator 1231 of FIG. 13A, according to an embodiment of the present invention. Referring to FIG. 13B, the MOSFETs Q1, Q2, Q3, Q4, Q5 and Q6 and the connection portion 1310 are laid out symmetrically between the first high resolution transmission line 1210 and the second high resolution transmission line 1220.

Referring to FIG. 13A, a line from node A to node D of the connection portion 1310 is electrically insulated from a line from node B to node C. For example, the line from node A to node D and the line from node B to node C may be implemented with different metal layers. In that case, the connection portion 1310 is implemented with a symmetric structure between the first high resolution transmission line 1210 and the second high resolution transmission line 1220.

Figure 13C:
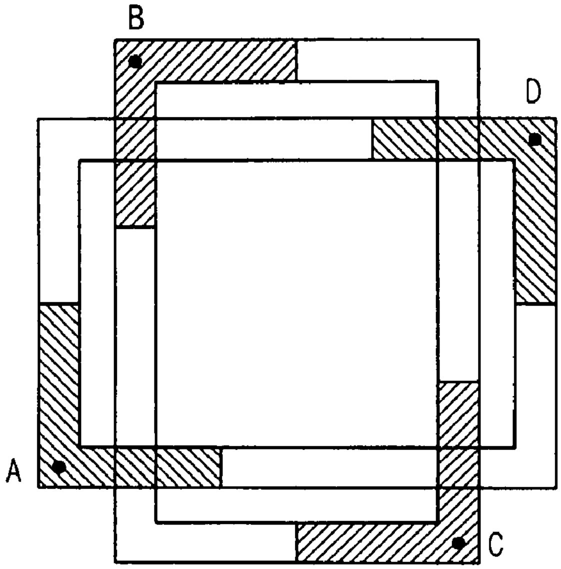
FIG. 13C illustrates layout of a connection in the comparator of FIG. 13A, according to an embodiment of the present invention.

FIG. 13C illustrates a layout of such a symmetric structure of the line from node A to node D and the line from node B to node C between the first high resolution transmission line 1210 and the second high resolution transmission line 1220. In FIG. 13C, the hatched areas represent a different metal layer from the non-hatched areas with insulation between such metal layers. The line between the nodes A and D is implemented using such two metal layers, and the line between the nodes B and C is also implemented using such two metal layers.

Figure 14:
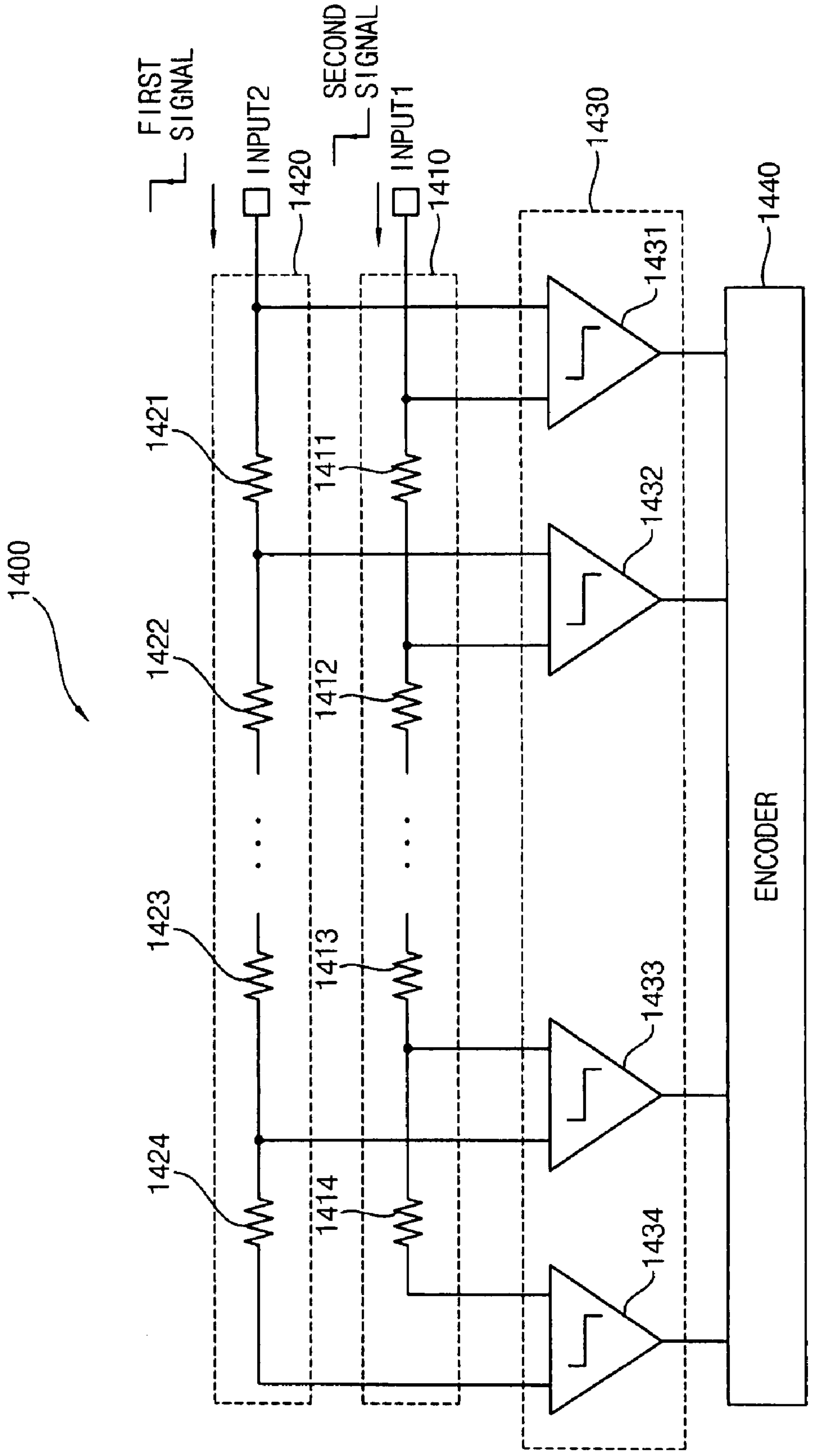
FIG. 14 is a circuit diagram of the high resolution time-to-digital converter in FIG. 4A, according to another embodiment of the present invention.

FIG. 14 is a circuit diagram of a high resolution time-to-digital converter (TDC) 1400 which may be the high resolution TDC 410 of FIG. 4A according to another example embodiment of the present invention. The high resolution TDC 1400 includes a first high resolution transmission line 1410 comprised of first resistors 1411, 1412, 1413 and 1414 that are serially connected and a second high resolution transmission line 1420 comprised of second resistors 1421, 1422, 1423 and 1424 that are serially connected.

Each of the first resistors 1411, 1412, 1413 and 1414 has a first resistance R1, and each of the second resistors 1421, 1422, 1423 and 1424 has a second resistance R2 that is different from the first resistance R1. The high resolution TDC 1400 also includes a comparator unit 1430 comprised of a plurality of comparators 1431, 1432, 1433, and 1434 and an encoder 1440 (that is the encoder 412 in FIG. 4A).

In contrast to FIG. 9, the first signal is transmitted through the first high resolution transmission line 1410 along a same direction as the second signal being transmitted through the second high resolution transmission line 1420. For example, the first signal is provided to a first node of the first high resolution transmission line 1410 for being transmitted to a last node through the first resistors 1411, 1412, 1413 and 1414. The second signal is provided to a first node of the second high resolution transmission line 1420 for being transmitted to a last node through the second resistors 1421, 1422, 1423 and 1424.

The first node of the first transmission line 1410 and the first node of the second transmission line 1420 are couple to inputs of the comparator 1431 that compares voltages at such first nodes. In addition, the last node of the first transmission line 1410 and the last node of the second transmission line 1420 are coupled to inputs of the comparator 1434 that compares voltages at such last nodes.

In addition, the comparator 1432 compares a voltage at a node between the resistors 1411 and 1412 of the first transmission line 1410 with a voltage at a node between the resistors 1424 and 1423 of the second transmission line 1420. Furthermore, the comparator 1433 compares a voltage at a node between the resistors 1413 and 1414 of the first transmission line 1410 with a voltage at a node between the resistors 1421 and 1422 of the second transmission line 1420.

The outputs of the comparators 1431, 1432, 1433, and 1434 are provided to the encoder 1440 that generates a high resolution digital code indicating the time difference between the first and second signals from such outputs. For example, the encoder 1440 generates a digital binary code corresponding to a delay time between the first and second signals from such outputs of the comparators 1431, 1432, 1433, and 1434.

Similar to FIG. 9, each of the first and second resistors in the high resolution TDC 1400 of FIG. 14 have a respective resistance that is less than 10 ohms for a quantization step that is less than 1 ps. Such resistors with small resistances may be implemented with metal lines and via plugs.

In the example embodiment of FIG. 4A, the high resolution TDC 410 includes the respective encoder 410 that is separate from the respective encoder 422 for the low resolution TDC 420. However, the present invention may also be practiced with just one same encoder that generates a single time difference digital code from the outputs of the flip-flops 831, 832, 833, and 834 of FIG. 8 and the outputs of the comparator unit 930 in FIG. 9 or 1430 of FIG. 14.

Figure 15:
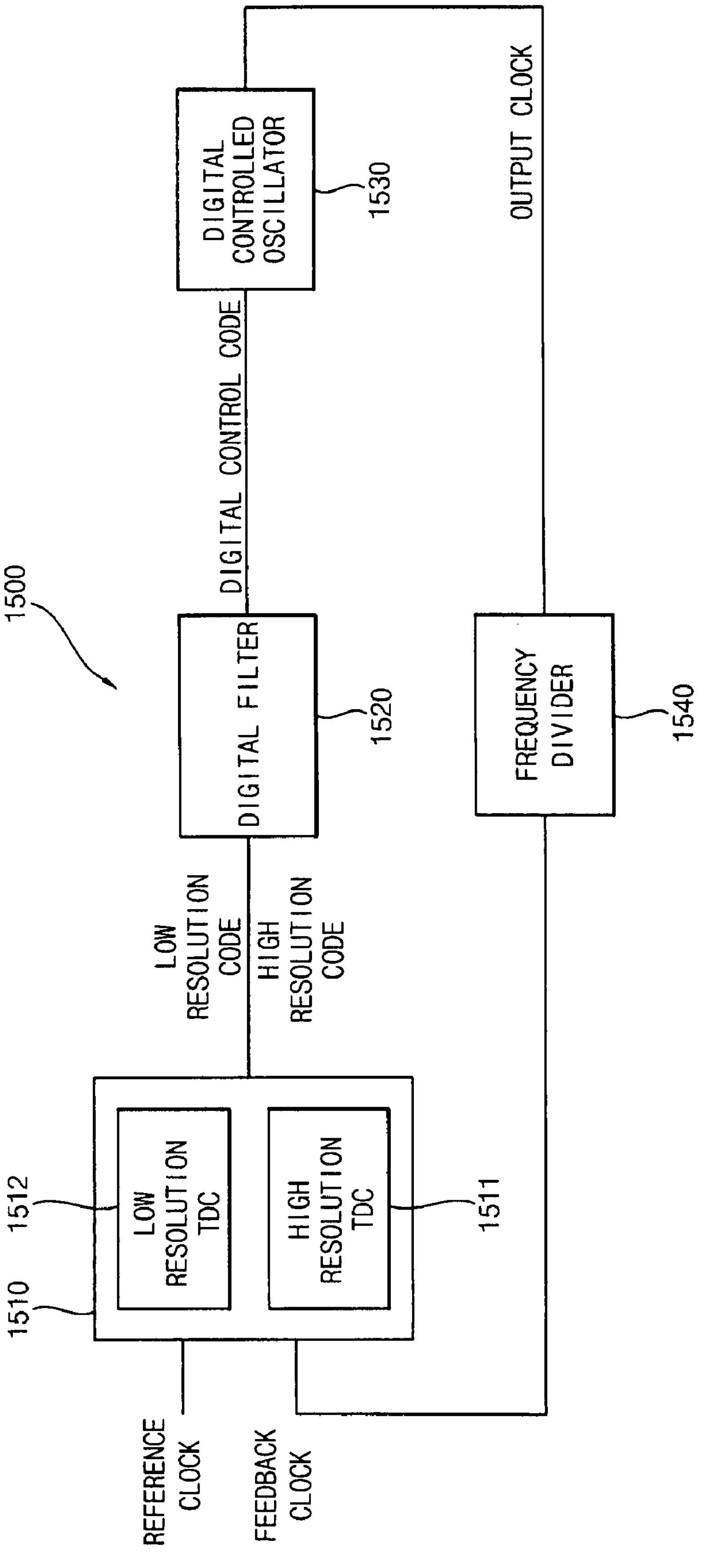
FIG. 15 is a block diagram of a digital phase-locked loop including the time-to-digital converter of FIG. 4A, according to an example embodiment of the present invention.

FIG. 15 is a block diagram of a digital phase-locked loop (DPLL) 1500 according to an example embodiment of the present invention. The DPLL 1500 includes a time-to-digital converter 1510, a digital filter 1520, a digital-controlled oscillator 1530, and a frequency divider 1540.

The time-to-digital converter 1510 includes a low resolution time-to-digital converter (TDC) 1512 having a first quantization step and a high resolution time-to-digital converter (TDC) 1511 having a second quantization step that is smaller than the first quantization step. Such low and high resolution TDCs 1512 and 1511, respectively, of FIG. 15 are similar to the low and high resolution TDCs 420 and 410 of FIG. 4A for example.

The low and high resolution TDCs 1512 and 1511 generate a low resolution digital code and a high resolution digital code for indicating a time difference between a reference clock and a feedback clock. The digital filter 1520 processes such digital codes from the low and high resolution TDCs 1512 and 1511 to generate a digital control code. For example, the digital filter 1520 may include a data processor that performs the steps of the flow-chart of FIG. 16.

The digital-controlled oscillator 1530 generates an output clock having a frequency corresponding to the digital control code. The frequency divider 1540 generates the feedback clock by frequency-division of the output clock. However, the present invention may also be practiced when the digital phase-locked loop 1500 does not include the frequency divider 1540. In that case, the output clock from the digital controlled oscillator is the feedback clock to the time-to-digital converter 1510.

In this manner, the time-to-digital converter according to embodiments of the present invention has a small dead-zone when the time difference between the first and second signals is measured with high resolution by the high resolution TDC. In addition, the time-to-digital converter according to embodiments of the present invention has a large measurement range when the time difference between the first and second signals is measured with the high quantization step of the low resolution TDC. The high resolution TDC includes resistors having small resistances implemented with metal lines and via plugs to reduce chip size.

While the present invention has been shown and described with reference to exemplary embodiments thereof, it will be understood by those of ordinary skill in the art that various changes in form and detail may be made herein without departing from the spirit and scope of the present invention, as defined by the following claims.

The present invention is limited only as defined in the following claims and equivalents thereof.

What is claimed is:

1. A time-to-digital converter comprising:

a low resolution time-to-digital converter for measuring a time difference between first and second signals with a first quantization step; and a high resolution time-to-digital converter for measuring the time difference between the first and second signals with a second quantization step that is smaller than the first quantization step;

wherein the high resolution time-to-digital converter includes:

a first high resolution transmission line comprised of first resistors that are serially connected for transmitting the first signal;

a second high resolution transmission line comprised of second resistors that are serially connected for transmitting the second signal;

a plurality of comparators, each comparing a respective first voltage of a respective first node of the first high resolution transmission line and a respective second voltage of a respective second node of the second high resolution transmission line; and an encoder for generating a high resolution digital code from outputs of the comparators.

2. The time-to-digital converter of claim 1, wherein the encoder for generating the high resolution digital code is a same one encoder for generating a low resolution digital code for the low resolution time-to-digital converter.

3. The time-to-digital converter of claim 1, wherein the encoder for generating the high resolution digital code is separate from another encoder for generating a low resolution digital code for the low resolution time-to-digital converter.

4. The time-to-digital converter of claim 1, wherein a first direction of transmission of the first signal through the first high resolution transmission line is same as a second direction of transmission of the second signal through the second high resolution transmission line.

5. The time-to-digital converter of claim 4, wherein a first resistance of each of the first resistors is same as a second resistance of each of the second resistors.

6. The time-to-digital converter of claim 1, wherein a first direction of transmission of the first signal through the first high resolution transmission line is opposite from a second direction of transmission of the second signal through the second high resolution transmission line.

7. The time-to-digital converter of claim 6, wherein a first resistance of each of the first resistors is different from a second resistance of each of the second resistors.

8. The time-to-digital converter of claim 1, wherein the first and second resistors are fabricated with metal lines and via plugs.

9. The time-to-digital converter of claim 1, wherein each of the comparators is laid out symmetrically between the first and second high resolution transmission lines.

10. The time-to-digital converter of claim 1, wherein the time-to-digital converter is connected within a digital phase-locked loop.

11. The time-to-digital converter of claim 10, wherein the digital phase-locked loop includes:

a digital filter that generates a digital control code from a low resolution code received from the low resolution time-to-digital converter and from a high resolution code received from the high resolution time-to-digital converter;

a digital controlled oscillator that generates an output clock signal with a frequency dependent on the digital control code; and a frequency divider that generates a divided clock signal having a lower frequency than the output clock signal;

wherein the divided clock signal is the first signal, and wherein the second signal is a reference clock signal.

12. The time-to-digital converter of claim 1, wherein the low and high resolution time-to-digital converters are fabricated on a same integrated circuit die.

13. The time-to-digital converter of claim 1, further comprising:

at least one encoder for generating a digital code corresponding to the time difference between the first and second signals from a respective code received from each of the low and high resolution time-to-digital converters.

14. The time-to-digital converter of claim 1, wherein the low resolution time-to-digital converter has a wider measurement range than the high resolution time-to-digital converter.

15. The time-to-digital converter of claim 1, wherein the first signal is applied to the low resolution time-to-digital converter after a delay through the high resolution time-to-digital converter, and wherein the second signal is applied simultaneously to the low and high resolution time-to-digital converters.

16. The time-to-digital converter of claim 1, wherein the first and second signals are applied simultaneously to the low and high resolution time-to-digital converters.

17. The time-to-digital converter of claim 1, wherein the first and second signals are applied to the low resolution time-to-digital converter after respective delays through the high resolution time-to-digital converter.

18. The time-to-digital converter of claim 1, wherein the low resolution time-to-digital converter includes:

a first transmission line comprised of a plurality of active delay units that are series connected for transmitting the first signal;

a second transmission line for transmitting the second signal;

a plurality of flip-flops each having a respective input terminal connected to a respective node between the active delay units, and each having a respective clock terminal connected to the second transmission line; and an encoder for generating a low resolution digital code from outputs of the flip-flops.

19. The time-to-digital converter of claim 18, wherein the plurality of active delay units is a plurality of inverters each providing a predetermined same delay.

* * * * *